US010803949B2

United States Patent
Berger et al.

(10) Patent No.: US 10,803,949 B2
(45) Date of Patent: Oct. 13, 2020

(54) MASTER SLAVE LEVEL SHIFT LATCH FOR WORD LINE DECODER MEMORY ARCHITECTURE

(71) Applicant: SPIN MEMORY, Inc., Fremont, CA (US)

(72) Inventors: Neal Berger, Cupertino, CA (US); Susmita Karmakar, Fremont, CA (US); Benjamin Louie, Fremont, CA (US)

(73) Assignee: Spin Memory, Inc., Fremont, CA (US)

( * ) Notice: Subject to any disclaimer, the term of this patent is extended or adjusted under 35 U.S.C. 154(b) by 0 days.

(21) Appl. No.: 16/294,920

(22) Filed: Mar. 7, 2019

(65) Prior Publication Data

US 2020/0286561 A1 Sep. 10, 2020

(51) Int. Cl.
*G11C 8/10* (2006.01)
*G11C 16/08* (2006.01)
*H01L 27/11* (2006.01)
*H01L 43/08* (2006.01)
*G11C 11/16* (2006.01)

(52) U.S. Cl.
CPC ............... *G11C 16/08* (2013.01); *G11C 8/10* (2013.01); *G11C 11/161* (2013.01); *H01L 27/1104* (2013.01); *H01L 43/08* (2013.01)

(58) Field of Classification Search
CPC ..................................... G11C 8/06; G11C 8/08
USPC ........................................ 365/230.06, 230.08
See application file for complete search history.

(56) References Cited

U.S. PATENT DOCUMENTS

| 4,825,420 | A | * | 4/1989 | Min | G11C 8/06 |
| | | | | | 365/230.08 |
| 5,689,517 | A | * | 11/1997 | Ruparel | G01R 31/31704 |
| | | | | | 307/418 |
| 5,844,857 | A | * | 12/1998 | Son | G11C 8/18 |
| | | | | | 365/230.06 |
| 6,006,348 | A | * | 12/1999 | Sode | H03K 3/0375 |
| | | | | | 714/731 |
| 6,456,113 | B2 | * | 9/2002 | Kanba | H03K 3/0372 |
| | | | | | 326/93 |
| 6,484,231 | B1 | * | 11/2002 | Kim | G11C 7/103 |
| | | | | | 365/189.02 |
| 7,710,796 | B2 | * | 5/2010 | Cottier | G11C 11/418 |
| | | | | | 365/189.04 |
| 8,427,888 | B2 | * | 4/2013 | Lu | G11C 8/10 |
| | | | | | 365/185.18 |
| 8,667,349 | B2 | * | 3/2014 | Hsieh | G01R 31/318541 |
| | | | | | 714/726 |

* cited by examiner

*Primary Examiner* — Son L Mai

(57) ABSTRACT

A clocked driver circuit can include a master-slave level shifter latch and a driver. The master-slave level shifter latch can be configured to receive an input signal upon a first state of a clock signal, latch the input signal upon a second state of the clock signal and generate a level shifted output signal corresponding to the latched input signal. The driver can be configured to receive the level shifted output signal from the master-slave level shifter and drive the output signal on a line. The signal levels of the output signal can be greater than the signal level of the input signal.

22 Claims, 7 Drawing Sheets

ND DECODER MEMORY
MASTER SLAVE LEVEL SHIFT LATCH FOR WORD LINE DECODER MEMORY ARCHITECTURE

BACKGROUND

Computing systems have made significant contributions toward the advancement of modern society and are utilized in a number of applications to achieve advantageous results. Numerous devices, such as desktop personal computers (PCs), laptop PCs, tablet PCs, netbooks, smart phones, servers, and the like have facilitated increased productivity and reduced costs in communicating and analyzing data in most areas of entertainment, education, business, and science. One common aspect of computing systems is computing device readable media, commonly referred to as memory.

Data and instructions used by the computing system can be stored in and retrieved from one or more memory devices. When reading or writing to memory a corresponding read or write voltage potential is applied to a given word line based upon a decoded memory address. Referring to FIG. 1, a block diagram of a word line decoder and driver path architecture, according to the conventional art, is shown. The word line decoder and driver path 100 can include a plurality of flip flops 110 configured to latch a received address 120 upon receipt of a clock signal (e.g., rising or falling edge of a system clock signal) 130. A set of address buffers 140 can be configured to buffer the latched address bits from the flip flops 110. A word line pre-decoder 150 can be configured to partially decode the address in the address buffer 140. In one implementation, the word line pre-decoder 150 can be configured to decode a block, bank and/or the like portion of the memory from the address. A word line decoder 160 can be configured to decode a given word line from the partially decoded address from the word line pre-decoder 150. A level shifter 170 can be configured to shift the relatively low voltage potential signal propagating through the flip flops 110, address buffer 140, word line pre-decoder 150 and word line decoder 160 to an appropriate high voltage potential signal. A high voltage driver 180 can drive the word line 190 with the appropriate high voltage potential signal from the level shifter 170 during a read, write or erase operation. The combination of the flip flops 110, address buffers 140, word line pre-decoder 150 and word line decoder 160 can comprise an address decoder circuit, and the combination of the level shifter 170 and high voltage driver 180 can comprise a word line driver circuit.

The propagation delay through the word line decoder and driver path can be the sum of the clock-data out set up time of the flip flops 110 $T_{C \rightarrow Q}$, the propagation delay through the address buffers 140 $T_{AB}$, the propagation delay through the word line pre-decoder 150 $T_{WPD}$, the propagation delay through the word line decoder 160 $T_{WD}$, and the propagation delay through the level shifter 170 and high voltage driver 180 $T_{WDR}$. However, as computing devices continue to evolve there is a continuing need for faster memory devices. One possible way to increase the speed of the memory device is to reduce the propagation delay through the word line decoder and driver path. Therefore, there is a need for an improved word line decoder and driver path architecture.

SUMMARY

The present technology may best be understood by referring to the following description and accompanying drawings that are used to illustrate aspects of the present technology that are directed toward clocked driver circuits.

In one embodiment, a memory device can include a master-slave level shifter latch and a driver. The master-slave level shifter latch can be configured to receive a plurality of decoded address signals upon a first state of a clock signal, latch the received plurality of decoded address signals upon a second state of the clock signal and output a plurality of word line signals corresponding to the latched plurality of decoded address signals. In one implementation, the decoded address signals can include a first and second state and the word line signals can include a third and fourth state, wherein a potential difference between the third and fourth states is greater than a potential difference between the first and second states. The driver can be configured to receive the plurality of word line signals and drive corresponding word lines with the word line signals.

In another embodiment, a device can include a first latch, a second latch and a plurality of transmission gates. A first latch can include a first inverter and a second inverter. The first latch can operate from a first supply potential. A first transmission gate can include a first control terminal to receive a clock signal, a second control terminal to receive an inverse of the clock signal, an input to receive a decoded address signal, and an output coupled to an input of the first inverter. The first transmission gate can be configured to transfer the received decoded address signal to the input of the first inverter during a first state of the clock signal. A second transmission gate can include a control terminal to receive the inverse of the clock signal, a second control terminal to receive the clock signal, an input coupled to an output of the second inverter, and an output coupled to the input of the first invert. The second transmission gate can be configured to latch the received decoded address signal in the first latch during a second state of the clock signal. A third and fourth transmission gate can include respect control terminals to receive the clock signal. The third and fourth transmission gates can be configured to isolate the second latch from the first latch during the first state of the clock signal and couple the inputs of the second latch to the outputs of the first latch during the second state of the clock signal. The second latch can include a third inverter cross coupled to a fourth inverter. The input of the second latch can be configured to receive the decoded address signal latch during the second state of the clock signal from the first latch, and the output of the second latch can be configured to output a level shifted word line signal corresponding to the received decoded address signal. The second latch can operate from a second supply potential that is greater than the first supply potential.

In yet another embodiment, a memory device can include a memory cell array, an address buffer, an address decoder, a master-slave level shifter latch and a word line driver. The address buffer can be configured to buffer a plurality of address signals. The address decoder circuit can be configured to receive the buffered plurality of address signals and output a plurality of decoded address signals. The master-slave level shifter latch can be configured to receive the plurality of decoded address signals upon a first state of a clock signal, to latch and level shift the decoded address signals upon a second state of a clock signal and generate a corresponding plurality of word line signals, and to output a plurality of word line signals. The address decoder circuit can be configured to operate from a first supply potential, while the level shifter latch can be configured to operate from a second supply potential that is greater than the first supply potential. The word line driver can be configured to receive the plurality of word line signals and drive the plurality of word line signals on word lines of the memory cell array.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

Aspects of the present technology are illustrated by way of example and not by way of limitation, in the figures of the accompanying drawings and in which like reference numerals refer to similar elements and in which.

DETAILED DESCRIPTION

Figure 1:
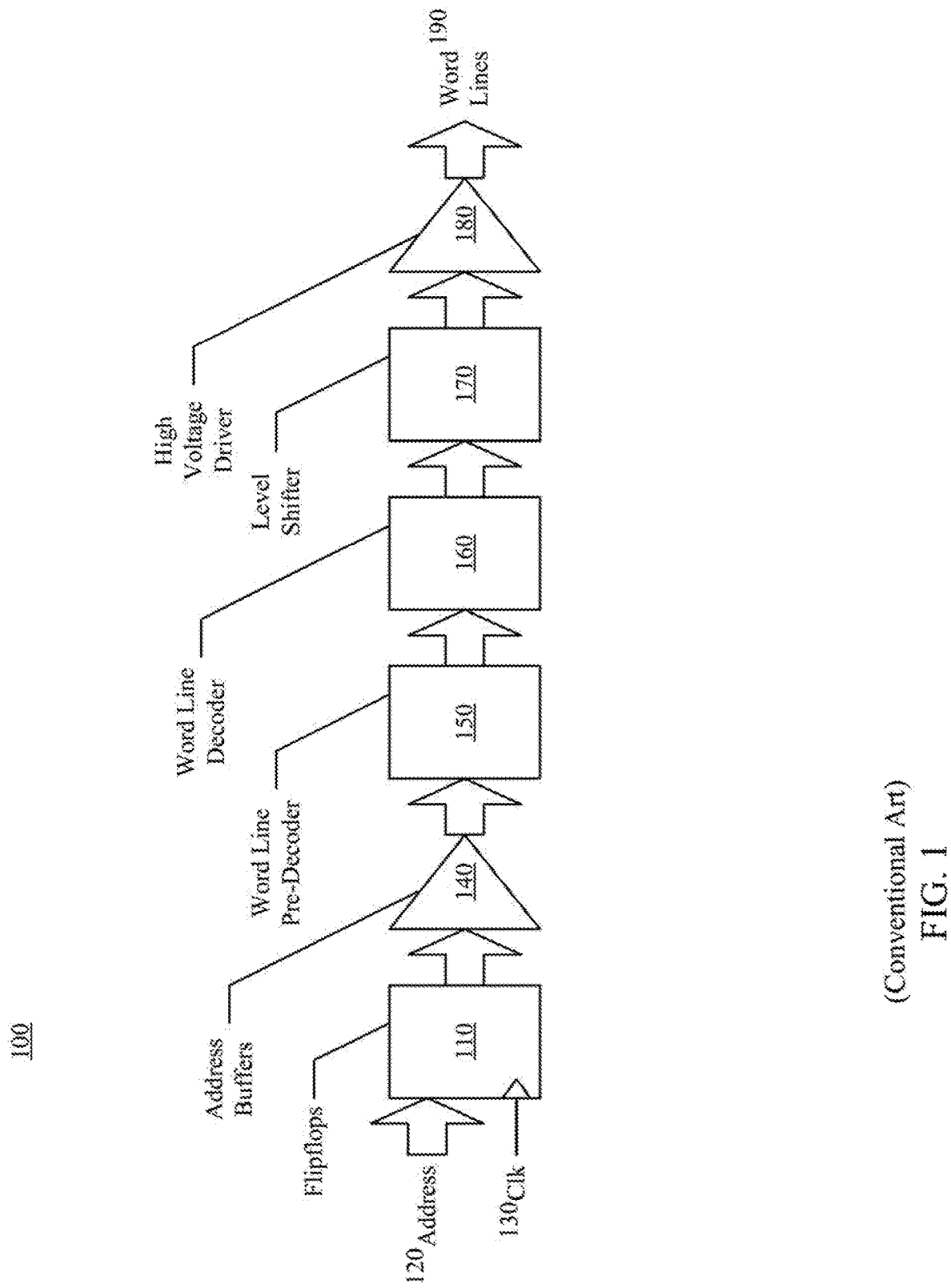
FIG. 1 shows a block diagram of a word line decoder and driver path architecture, according to the conventional art.

Reference will now be made in detail to the aspects of the present technology, examples of which are illustrated in the accompanying drawings. While the present technology will be described in conjunction with these aspects, it will be understood that they are not intended to limit the invention to these aspects. On the contrary, the invention is intended to cover alternatives, modifications and equivalents, which may be included within the scope of the invention as defined by the appended claims. Furthermore, in the following detailed description of the present technology, numerous specific details are set forth in order to provide a thorough understanding of the present technology. However, it is understood that the present technology may be practiced without these specific details. In other instances, well-known methods, procedures, components, and circuits have not been described in detail as not to unnecessarily obscure aspects of the present technology.

Some aspects of the present technology which follow are presented in terms of routines, modules, logic blocks, and other symbolic representations of operations on data within one or more electronic devices. The descriptions and representations are the means used by those skilled in the art to most effectively convey the substance of their work to others skilled in the art. A routine, module, logic block and/or the like, is herein, and generally, conceived to be a self-consistent sequence of processes or instructions leading to a desired result. The processes are those including physical manipulations of physical quantities. Usually, though not necessarily, these physical manipulations take the form of electric or magnetic signals capable of being stored, transferred, compared and otherwise manipulated in an electronic device. For reasons of convenience, and with reference to common usage, these signals are referred to as data, bits, values, elements, symbols, characters, terms, numbers, strings, and/or the like with reference to aspects of the present technology.

It should be borne in mind, however, that all of these terms are to be interpreted as referencing physical manipulations and quantities and are merely convenient labels and are to be interpreted further in view of terms commonly used in the art. Unless specifically stated otherwise as apparent from the following discussion, it is understood that through discussions of the present technology, discussions utilizing the terms such as "receiving," and/or the like, refer to the actions and processes of an electronic device such as an electronic computing device that manipulates and transforms data. The data is represented as physical (e.g., electronic) quantities within the electronic device's logic circuits, registers, memories and/or the like, and is transformed into other data similarly represented as physical quantities within the electronic device.

In this application, the use of the disjunctive is intended to include the conjunctive. The use of definite or indefinite articles is not intended to indicate cardinality. In particular, a reference to "the" object or "a" object is intended to denote also one of a possible plurality of such objects. It is also to be understood that the phraseology and terminology used herein is for the purpose of description and should not be regarded as limiting.

Figure 2:
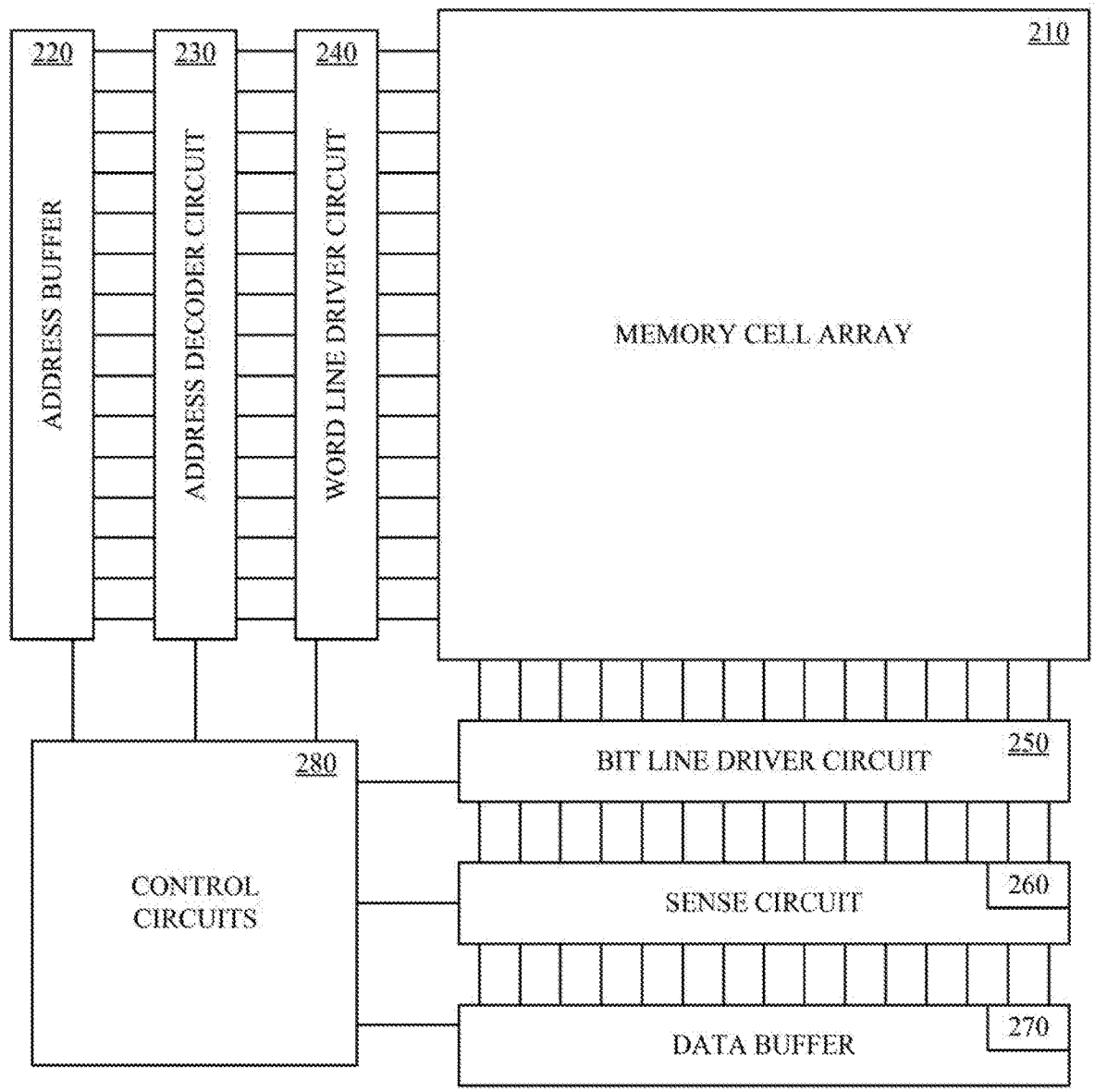
FIG. 2 shows a block diagram of a memory device, in accordance with aspects of the present technology.

Referring now to FIG. 2, a block diagram of a memory device, in accordance with aspects of the present technology, is shown. The memory device 200 can be a Magnetoresistive Random Access Memory (MRAM), Spin Torque Magnetoresistive Random Access Memory (ST-MRAM), a Phase Change Memory (PCM), a stackable cross-gridded Phase Change Memory, Resistive Random Access Memory (ReRAM), or similar memory device. In aspects, the memory device 200 can include a memory cell array 210, an address buffer 220, an address decoder circuit 230, a word line driver circuit 240, a bit line driver circuit 250, a sense circuit 260, a data buffer 270, and control circuit 280. The memory device 200 can also include other well-known circuits that are not necessary for an understanding of the present technology and therefore are not discussed herein.

In aspects, the memory cell array 210 can include a plurality of memory cells organized in rows and columns, with sets of word lines, bit lines and optionally source lines spanning the array of cells throughout the chip. The address buffer 220 can be configured to receive and buffer a plurality of address signals. The address decoder 230 can receive the plurality of address signals buffered by the address buffer 220 and output a plurality of decoded address signals. The address decoder 230 can map a given memory address to a particular row of memory cells in the array.

In aspects, the output of the address decoder 230 can be input to the word line driver 240 upon a first state of a clock signal. In one implementation, the word line driver 240 can receive the plurality of decoded address signals upon receipt of a low state of a clock signal and latch the plurality of decoded address signal upon a high state of the clock signal. The word line driver 240 can level shift the received decoded address signals that include one or more of a first potential voltage and a second potential voltage to word line drive signals that include one or more of a third potential voltage and a fourth potential voltage, and latch the plurality of word line drive signals that include the one or more of the third potential voltage and the fourth potential voltage. The potential difference between the third and fourth potential voltages can be greater than the potential difference between the first and second potential voltages. The output of the word line driver 240 can drive the word lines to select a given word line of the array 210 based on the plurality of word line drive signals.

In aspects, the bit line driver 250 and the sense circuit 260 utilize the bit lines, and/or optionally the source lines, of the array 210 to read from and write to memory cells of a selected word line of the array 210. The data read from and written to the memory cells can be buffered in the data buffer 270. The control circuit 280 can generate one or more control signals for the control of one or more of the address buffer 220, the address decoder circuit 230, the word line driver circuit 240, the bit line driver circuit 250, the sense circuit 260, the data buffer 270.

Figure 3:
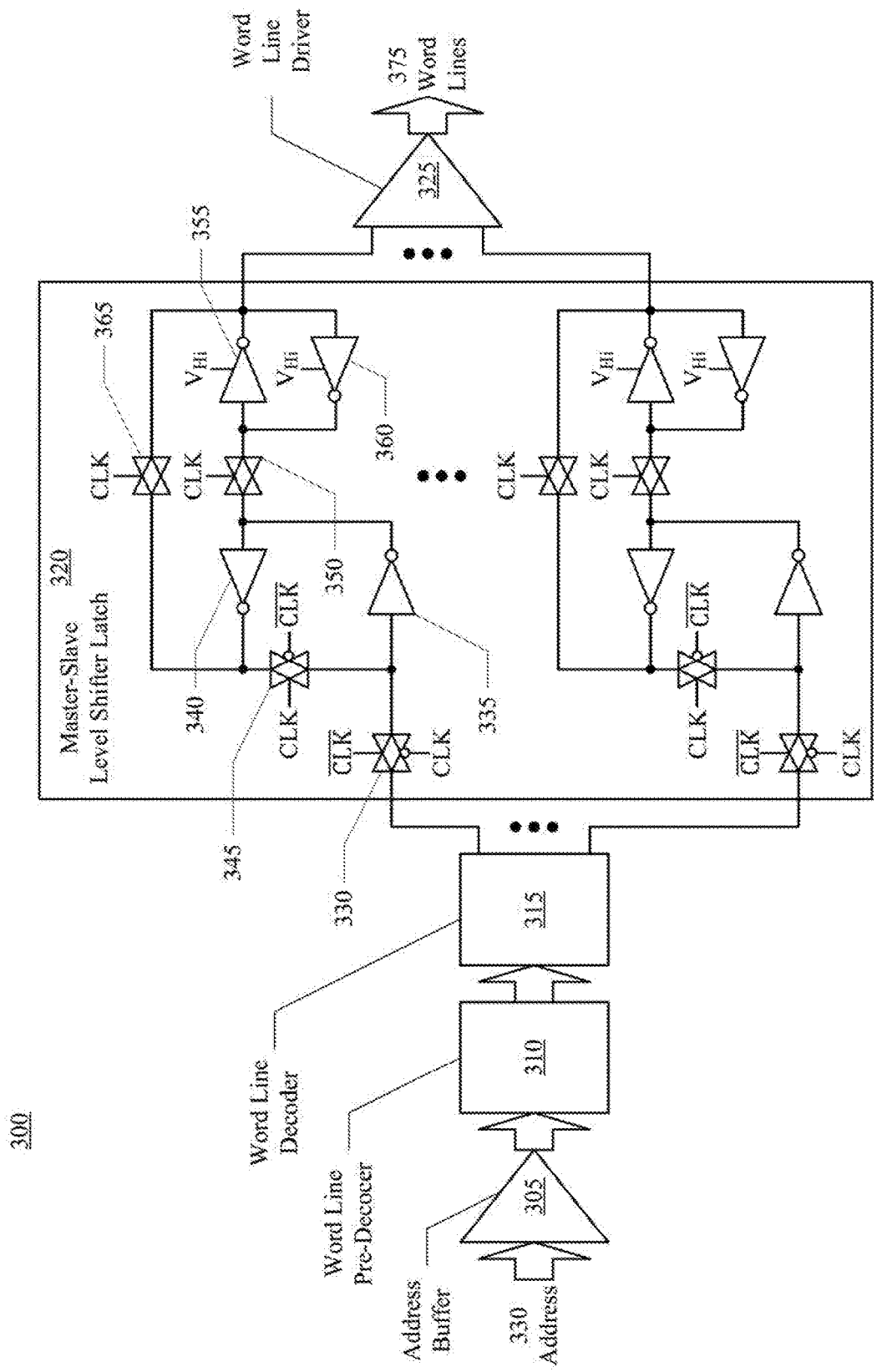
FIG. 3 shows a block diagram of a word line decoder and driver path architecture, in accordance with aspects of the present technology.

Referring now to FIG. 3, a block diagram of a word line decoder and driver path architecture, in accordance with aspects of the present technology, is shown. In aspects, the word line decoder and driver path architecture 300 can include an address buffer 305, a word line pre-decoder 310, a word line decoder 315, a master-slave level shifter latch 320, and a word line driver 325. The address buffer 305 can be configured to receive and buffer a plurality of address signals 330. The word line pre-decoder 310 can be configured to receive the buffered plurality of address signals and output partially decoded address signals. In one implementation, the word line pre-decoder 310 can be configured to decode a block, bank and/or the like portion of the memory from the buffered plurality of address signals. The word line decoder 315 can be configured to receive the partially decoded address signal and output a plurality of decoded address signals. In one implementation, the word line decoder 315 can be configured to decode a given word line from the buffered plurality of address signals. The master-slave level shifter latch 320 can be configured to receive the plurality of decoded address signals upon a first state (e.g., low state) of a clock signal, latch and level shift the plurality of decoded address signals to generate a corresponding plurality of word line signals upon a second state (e.g., high state) of the clock signal, and output the plurality of word line signals. In one implementation, the plurality of decoded address signals can include one or more of a first potential voltage and a second potential voltage. The plurality of word line signals can include one or more of a third potential voltage and a fourth potential voltage, wherein a potential difference between the third potential voltage and the fourth potential voltage is greater than a potential difference between the first potential voltage and the second potential voltage. For example, the decoded address signals can be signals having either a ground potential state (e.g., low logic state) or a low supply voltage potential (e.g., high logic state). The word line signals can be signals having either a ground potential state (e.g., low drive state) or a high supply voltage potential (e.g., high drive state).

In aspects, the master-slave level shifter latch 320 can include a master latch 330-345 and a slave latch 350-365, for each of the plurality of word lines. Each master latch 330-345 can be configured to receive one of the plurality of decoded address signals upon the first state (e.g., low state) of the clock signal and latch the received one of the plurality of decoded address signal upon the second state (e.g., high state) of the clock signal. Each slave latch 3350-365 can be configured to receive the latched one of the plurality of decoded address signals upon the second state (e.g., high state) of the clock signal, level shift the latched one of the plurality of decoded address signals to generate a corresponding one of the plurality of word line signals upon the second state (e.g., high state) of the clock signal, and latched the one of the plurality of work line signals at the output of the master-slave level shifter latch 320 upon the next first state (e.g., low state) of the clock signal.

Figure 4:
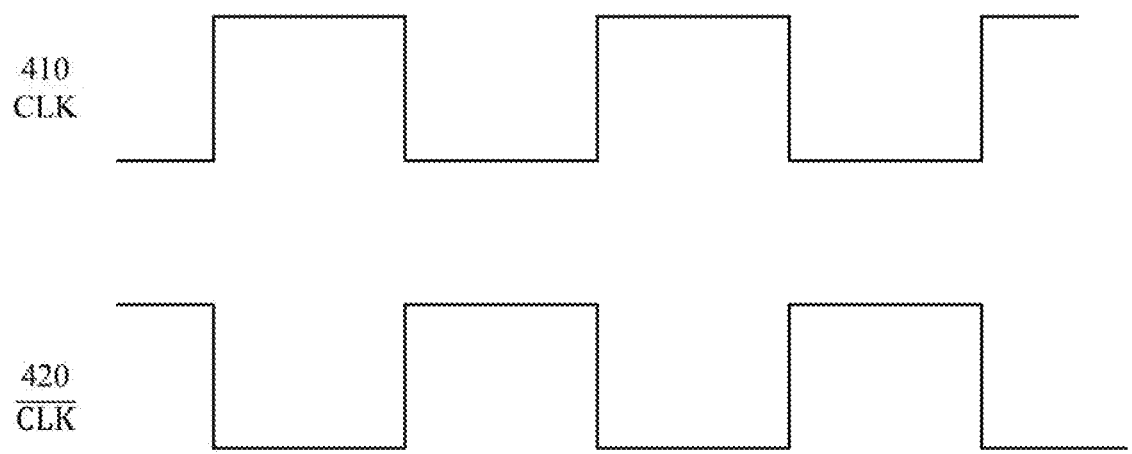
FIG. 4 shows a timing diagram illustrating a clock pulse utilized in the word line decoder and driver path architecture, in accordance with aspect of the present technology.

In one implementation, the master latch 330-345 can include a first transmission gate 330, a first inverter 335, a second inverter 340 and a second transmission gate 345. The slave latch 350-365 can include a third transmission gate 350, a third inverter 355, a fourth inverter 360 and a fourth transmission gate 365. The symbols "CLK" and "$\overline{\text{CLK}}$", as used herein, indicate the clock signal 410 and the inverse of the clock signal 420, respectively, as illustrated in FIG. 4. The "o" symbol on the control terminal of the first and second transmission gates 330, 345, as used herein, indicate that the transmission gate is in a low impedance state (e.g., on) when the signal at the respective control terminal is low and is in a high impedance state (e.g., off) when the signal at the respective control terminal is high. Control terminals of the first, second, third and fourth transmission gate 330, 345, 350, 365 that do not include the "o" symbol indicate that the transmission gate is in a low impedance state (e.g., on) when the signal at the respective control terminal is high and is in a high impedance state (e.g., off) when the signal at the respective control terminal is low. The first transmission gate 330 can include a first terminal to receive a first one of the plurality of decoded address signals, a second terminal to receive the clock signal (CLK), and a third terminal to receive the inverse of the clock signal ($\overline{\text{CLK}}$). The first transmission gate 330 can be configured to transfer a current state of a first one of the plurality of decoded address signals received on the first terminal to a fourth terminal of the first transmission gate 330 upon the first state (e.g., low state) of the clock signal (CLK). The first inverter 335 can include an input coupled to the fourth terminal of the first transmission gate 330, and the second inverter 340 can include an input coupled to an output of the first inverter 335. The second transmission gate 345 can include a first terminal coupled to an output of the second inverter 340, a second terminal to receive the clock signal (CLK), a third terminal to receive the inverse of the clock signal ($\overline{\text{CLK}}$), and a fourth terminal coupled to the input of the first inverter 335. The second transmission gate 345 can be configured to transfer a state of the output of the second inverter 340 to the input of the first inverter 335 upon the second state (e.g., high state) of the clock signal (CLK). Accordingly, the second transmission gate 345 cross couples the first inverter 335 to the second inverter 340 during the second state (e.g., high state) of the clock signal (CLK). The third transmission gate 350 can include a first terminal coupled to an output of the first inverter 335 and a second terminal to receive the clock signal (CLK). The fourth transmission gate 365 can include a first terminal coupled to the output of the second inverter 340 and a second terminal to receive the clock signal (CLK). The third transmission gate 350 can be configured to transfer a state of the output of the first inverter 335 to an input of the third inverter 355 upon the second state (e.g., high state) of the clock signal (CLK), and the fourth transmission gate 365 can be configured to transfer a state of the output of the second inverter 340 to an input of the fourth inverter 360 upon the second state (e.g., high state) of the clock signal (CLK). During the first state (e.g., low state) of the clock signal (CLK), the third transmission gate 350 and the fourth transmission gate 365 can isolate the third and fourth inverters 355, 360 from the first and second inverter 335, 340. The third inverter 355 and fourth inverter 360 can be cross coupled together. The third and fourth inverter 355, 360 can also include power terminal coupled to a high voltage source ($V_{Hi}$). The third and fourth inverter 355, 360 can be configured to level shift the one of the plurality of word lines signals from the first inverter 335, and latch the level shifted one of the plurality of word lines on a corresponding output upon the first state (e.g., low) of the clock signal (CLK). The output of the master-slave level shifter latch 320 can be taken at the output of the third inverter 355.

In one implementation, when the decoded address signal from the word line decoder 315 is in a logic low state, the first transmission gate 330 can pass the logic low state to the first inverter 335 when the clock signal (CLK) goes low and the inverse clock signal ($\overline{CLK}$) goes high. The output of the first invert 335 will go high in response to the logic low state passed by the first transmission gate 330 while the clock signal (CLK) is low. The output of the second inverter 340 will go low in response to the logic high at the output of the first inverter 335 while the clock signal (CLK) is low. In addition, the third and fourth transmission gates 350, 365 will block the signal at the output of the first and second inverter 335, 340 from affecting the states of the third and fourth inverters 355, 360. When the clock signal (CLK) goes high and the inverse clock signal ($\overline{CLK}$) goes low, the first transmission gate 330 will switch to a high impedance state isolating the input of the first inverter 335 from the word line decoder 315. The second transmission gate 345 will cross couple the first and second inverters 335, 340 together when the clock signal is high. In addition, the third and fourth transmission gate 350, 365 will coupled the output of the first and second inverters 335, 340 to the inputs of the fourth and third inverter 360, 355. In such case, the logic high at the output of the first inverter 335 that is transferred by the third transmission gate 350 to the input of the third inverter 355 will cause the output of the third inverter 355 to go to a low drive state. Likewise, the logic low at the output of the second inverter 340 that is transferred by the fourth transmission gate 365 to the input of the fourth inverter 360 will cause the output of the fourth inverter 360 to go to the high drive state, such that the cross coupled third and fourth inverters 355, 360 latch the low drive state at the output of the master-slave level shifter latch 320.

When the decoded address signal from the word line decoder 315 is in a logic high state, the first transmission gate 330 can pass the logic high state to the first inverter 335 when the clock signal (CLK) goes low and the inverse clock signal ($\overline{CLK}$) goes high. The output of the first invert 335 will go low in response to the logic high state passed by the first transmission gate 330 while the clock signal (CLK) is low. The output of the second inverter 340 will go high in response to the logic low at the output of the first inverter 335 while the clock signal (CLK) is low. In addition, the third and fourth transmission gates 350, 365 will block the signal at the output of the first and second inverter 335, 340 from affecting the states of the third and fourth inverters 355, 360. When the clock signal (CLK) goes high and the inverse clock signal ($\overline{CLK}$) goes low, the first transmission gate 330 will switch to a high impedance state isolating the input of the first inverter 335 from the word line decoder 315. The second transmission gate 345 will cross couple the first and second inverters 335, 340 together when the clock signal is high. In addition, the third and fourth transmission gate 350, 365 will couple the output of the first and second inverters 335, 340 to the inputs of the third and fourth inverter 355, 360. In such case, the logic low at the output of the first inverter 335 that is transferred by the third transmission gate 350 to the input of the third inverter 355 will cause the output of the third inverter 355 to go to a high drive state. Likewise, the logic high at the output of the second inverter 340 that is transferred by the fourth transmission gate 365 to the input of the fourth inverter 360 will cause the output of the fourth inverter 360 to go to the low state, such that the cross coupled third and fourth inverters 355, 360 latch the high drive state at the output of the master-slave level shifter latch 320.

Figure 5:
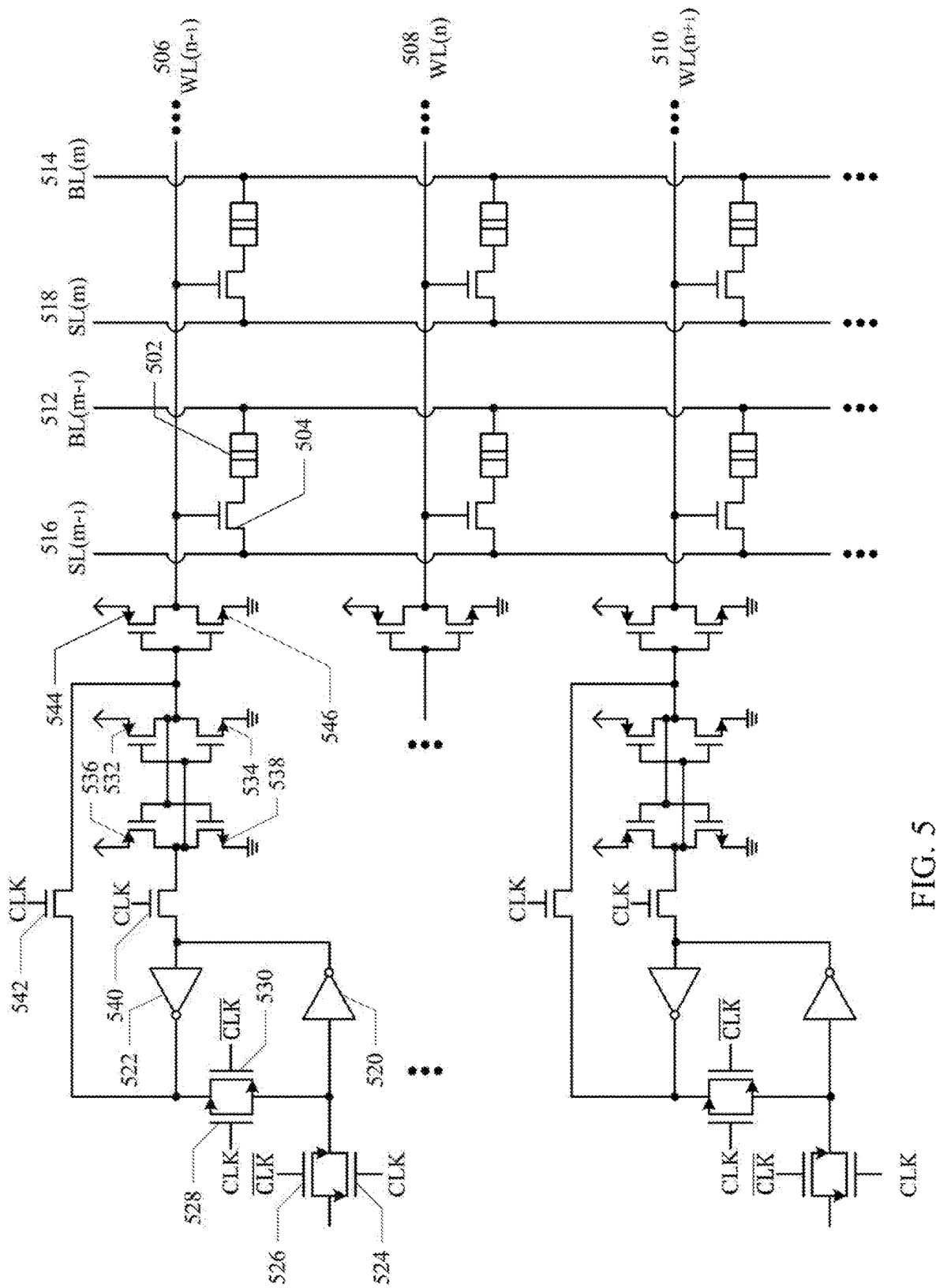
FIG. 5 shows a block diagram of a word line driver in combination with a memory cell array, in accordance with aspects of the present technology.

Referring now to FIG. 5, a block diagram of a master-slave level shifter latch and a word line driver in combination with a memory cell array, in accordance with aspects of the present technology, is shown. The memory cell array can be any one of a number of memory cell architectures, such as NAND Flash memory, Magnetoresistive Random Access Memory (MRAM), or the like that can benefit from a fast word line drive circuit due to characteristics such as relatively high capacitive word lines. While aspects of the present technology are described herein in conjunction with MRAM memory cell arrays, it will be understood that they are not intended to be limited thereto.

In aspects, the MRAM memory cell array can include a plurality of memory cells 502, 504, a plurality of word lines 506-510, a plurality of bit lines 512-514, and a plurality of source lines 516-518. The word lines 506-510 of the memory cell array can be organized along rows of the array. The bit lines 512-514 and the source lines 516-518 can be organized along columns of the array. Each memory cell 502, 504 can include a Magnetic Tunneling Junction (MTJ) cell 502 and an access transistor 504. In one implementation, the MTJ cells can be Spin Torque Magnetoresistive memory cells. The gates of the access transistors 504 arranged along rows of the array can be coupled to a respective word line 506. The sources of the access transistors 504 arranged along columns of the array can be coupled to respective source lines 516. A free magnetic layer of the MTJ cell 502 arranged along columns of the array can be coupled to respective bit lines 512.

In aspects, the magnetic polarity of the free layer of the MTJ cell 502, and corresponding logic state of the cell, can be changed to one of two states depending upon the direction of current flowing through the MTJ cell 502. For example, a logic '0' state can be written to the memory cell 502, 504 by biasing the respective bit line 512 at a bit line write potential (e.g., $V_{BLW}$), biasing the respective source line 516 at a ground potential, and driving the respective word line 506 at a word line write potential (e.g., $V_{WLW}=V_{Hi}$). A logic '1' state can be written to the given memory cell 502, 504 by biasing the respective bit line 512 at a ground potential, biasing the respective source line 516 at a source line write potential (e.g., $V_{SLW}$), and driving the respective word line 506 at the word line write potential (e.g., $V_{WLW}=V_{Hi}$). The state of the memory cell 502, 504 can be read by biasing the respective bit line 512 at a bit line read potential (e.g., $V_{BLR}$), biasing the respective source line 516 at a ground potential, driving the respective word line 506 at a word line read potential ($V_{WLR}=V_{Hi}$), and sensing the resulting current on the respective bit line 512.

In another example, a logic '0' state can be written to a given memory cell 502, 504 by biasing the respective bit line 512 at a bit line write potential (e.g., $V_{BLW}$), biasing the respective source line 516 at a ground potential, and driving the respective word line 506 at a word line write potential (e.g., $V_{WLW}=V_{Hi}$). A logic '1' state can be written to the given memory cell 502, 504 by biasing the respective bit line 512 at a ground potential, biasing the respective source line 516 at a source line write potential (e.g., $V_{SLW}$), and driving the respective word line 506 at the word line write potential (e.g., $V_{WLW}=V_{Hi}$). The state of the memory cell 502, 504 can be read by biasing the respective bit line 512 at a ground potential, biasing the respective source line 516 at a source line read potential (e.g., $V_{SLR}$), driving the respective word line 506 at a word line read potential (e.g., $V_{WLR}=V_{Hi}$), and sensing the resulting current on the respective source line 516.

In aspects, the master-slave level shifter latch and word line driver can include, for each of a plurality of word lines, a first latch 520, 522, a first transmission gate 524, 526, a second transmission gate 528, 530, a second latch 532-538, a third transmission gate 540, a fourth transmission gate 542, and an inverting driver 544, 546. The first latch can include a first inverter 520 and a second inverter 522. The first and second inverters 520, 522 can operate from a first supply potential. The first supply potential can for example be a low supply voltage potential relative to a ground potential. The second latch can include a third inverter 532, 534 and a fourth inverter 536, 538. The third invert 532, 534 and fourth inverter 536, 538 can operate from a second supply potential. The second supply potential can for example be a high supply voltage potential relative to the ground potential.

In aspects, the first transmission gate 524, 526 can include a first control terminal to receive a clock signal (CLK), a second control terminal to receive an inverse of the clock signal ($\overline{CLK}$), an input to receive a decoded address signal, and an output coupled to an input of the first inverter. The first transmission gate 524, 526 can be configured to transfer the received decoded address signal to the input of the first inverter 520 during a first state of the clock signal. In one implementation, the first transmission gate 524, 526 can include a p-channel Metal Oxide Semiconductor Field Effect Transistor (p-MOSFET) 524 and an n-channel Metal Oxide Semiconductor Field Effect Transistor (n-MOSFET). The drain of the p-MOSFET 524 and the source of the n-MOSFET 526 can receive the decoded address signal and the source of the p-MOSFET 524 and the drain of the n-MOSFET 526 can be coupled to the input of the first inverter 520. The gate of the p-MOSFET 524 can receive the clock signal (CLK) and the gate of the n-MOSFET 526 can receive the inverse of the clock signal ($\overline{CLK}$). The second transmission gate 528, 530 can include a first control terminal to receive the clock signal (CLK), a second control terminal to receive an inverse of the clock signal ($\overline{CLK}$), an input coupled to an output of the second inverter 522, and an output coupled to an input of the first inverter 520. The second transmission gate 528, 530 can be configured to cross couple the first and second inverters 520, 522 together during a second state of the clock signal (CLK), such that the first and second inverters 520, 522 latch the received decoded address signal during the second state of the clock signal. In one implementation, second transmission gate 528, 530 can include a n-MOSFET 528 and a p-MOSFET 530. The drain of the n-MOSFET 528 and the source of the p-MOSFET 530 can coupled to the output of the second inverter 522 and the source of the n-MOSFET 528 and the drain of the p-MOSFET 530 can be coupled to the input of the first inverter 520. The gate of the n-MOSFET 528 can receive the clock signal (CLK) and the gate of the p-MOSFET 530 can receive the inverse of the clock signal (CLK).

In aspects, the second latch 532-538 can include a third inverter 532, 534 cross coupled to a fourth inverter 536, 538. The third inverter 532, 534 and the fourth inverter 536, 538 can operate from a second supply potential that is greater than the first supply potential. An output of the second latch can be configured to output a level shifted word line signal corresponding to the received decoded address signal. In one implementation, the third inverter 532, 534 includes a first p-MOSFET 532 and a first n-MOSFET 534. A gate of the first p-MOSFET 532 and a gate of the first n-MOSFET 534 can be coupled together as the input of the third inverter 532, 534, a drain of the first p-MOSFET 532 and a drain of the first n-MOSFET 534 can be coupled together as the output of the third inverter 532, 534, and a source of the first p-MOSFET 532 and the source of the first n-MOSFET 534 can be coupled between the second supply potential. The fourth inverter 536, 538 can include a second p-MOSFET 536 and a second n-MOSFET 538. A gate of the second p-MOSFET 536 and a gate of the second n-MOSFET 538 can be coupled together as the input of the fourth inverter 536, 538, a drain of the second p-MOSFET 536 and a drain of the second n-MOSFET 538 can be coupled together as the output of the fourth inverter 536, 538, and a source of the second p-MOSFET 536 and the source of the second n-MOSFET 538 can be coupled between the second supply potential. It should also be appreciated that the drain and source of MOSFET devices are generally interchangeable, such that the description of the sources and drains of MOSFET herein can be interchanged.

In aspects, the third and fourth transmission gates 540, 542 can include respective control terminals to receive the clock signal (CLK). The third and fourth transmission gates can be configured to isolate the second latch 532-538 from the first latch 520-522 during the first state of the clock signal. In one implementation, third transmission gate 540 can be a n-MOSFET 540 including a gate coupled to the clock signal (CLK), a source coupled to the output of the first inverter 520 and the input of the second inverter 522, and a drain coupled to the input of the third inverter 532, 534. The fourth transmission gate 542 can be a n-MOSFET 542 including a gate coupled to the clock signal (CLK), a source coupled to the output of the second inverter 522 and the input of the second transmission gate 528, 530, and a drain coupled to an output of the third inverter 532, 534 and the input of the fourth inverter 536, 538.

In aspects, the inverting driver 544, 546 can include an input coupled to an output of the third inverter 532, 534 and an output coupled to a word line (WL(n−1)) 506. The inverting driver 544, 546 can operate from the second supply potential. In one implementation, the inverting driver 544, 546 can include a p-MOSFET 544 and a n-MOSFET 546. A gate of the p-MOSFET 544 and the gate of the n-MOSFET 546 can be coupled together as the input of the inverting driver 544, 546, a drain of the p-MOSFET 544 and a drain of the n-MOSFET 546 can be coupled together as the output of the inverting driver 544, 546, and a source of the p-MOSFET 544 and a source of the n-MOSFET 546 can be coupled between the second supply potential.

In aspects, the first latch 520, 522, the first transmission gate 524, 526, the second transmission gate 528, 530, the second latch 532-538, the third transmission gate 540, the fourth transmission gate 542 and the inverting driver 544, 546 can drive the word line 506 when the word line 506 is selected by a decoded address signal. For example, when the decoded address signal from the word line decoder is in a logic low state, the first transmission gate 524, 526 will pass the logic low state to the first inverter 520 when the clock signal (CLK) goes low and the inverse clock signal (CLK) goes high. The output of the first invert 520 will go high in response to the logic low state passed by the first transmission gate 524, 526 while the clock signal (CLK) is low. The output of the second inverter 522 will go low in response to the logic high at the input of the second inverter 522 while the clock signal (CLK) is low. In addition, the third and fourth transmission gates 540, 542 will block the signal at the output of the first and second inverters 520, 522 from affecting the states of the third and fourth inverters 532-536. When clock signal (CLK) goes high and the inverse clock signal ($\overline{CLK}$) goes low, the first transmission gate 524, 526 will switch to a high impedance state isolating the input of the first inverter 520 from receiving a change in the decoded address signal. The second transmission gate 528, 530 will cross couple the first and second inverters 520, 522 together when the clock signal is high. In addition, the third and fourth transmission gate 540, 542 will coupled the output of the first and second inverters 520, 522 to the inputs of the third and fourth inverter 532-538. In such case, the logic high at the output of the first inverter 520 that is transferred by the third transmission gate 540 to the input of the third inverter 532, 534 will cause the output of the third inverter 532, 534 to go to a low drive state. Likewise, the logic low at the output of the second inverter 522 that is transferred by the fourth transmission gate 542 to the input of the fourth inverter 536, 538 will cause the output of the fourth inverter 536, 538 to go to the high drive state, such that the cross coupled third and fourth inverters 532-536 latch the low drive state at the output of the second latch 532-538. The inverting driver 544, 546 can invert the low drive state to the high drive state and drive the high state onto the word line 506.

When the decoded address signal is in a logic high state, the first transmission gate 524, 526 will pass the logic high state to the first inverter 520 when the clock signal (CLK) goes low and the inverse clock signal ($\overline{CLK}$) goes high. The output of the first invert 520 will go low in response to the logic high state passed by the first transmission gate 524, 526 while the clock signal (CLK) is low. The output of the second inverter 522 will go high in response to the logic low at the output of the first inverter 520 while the clock signal (CLK) is low. In addition, the third and fourth transmission gates 540, 542 will block the signal at the output of the first and second inverter 520, 522 from affecting the states of the third and fourth inverters 532-538. When the clock signal (CLK) goes high and the inverse clock signal ($\overline{CLK}$) goes low, the first transmission gate 524, 526 will switch to a high impedance state isolating the input of the first inverter 520 from receiving a change in the decoded address signal. The second transmission gate 528, 530 will cross couple the first and second inverters 520, 522 together when the clock signal is high. In addition, the third and fourth transmission gate 540, 542 will couple the output of the first and second inverters 520, 522 to the inputs of the third and fourth inverter 532-538. In such case, the logic low at the output of the first inverter 520 that is transferred by the third transmission gate 540 to the input of the third inverter 532, 534 will cause the output of the third inverter 532, 534 to go to a high drive state. Likewise, the logic high at the output of the second inverter 522 that is transferred by the fourth transmission gate 542 to the input of the fourth inverter 536, 538 will cause the output of the fourth inverter 536, 538 to go to the low state, such that the cross coupled third and fourth inverters 532-538 latch the high drive state at the output of the second latch 532-538. The inverting driver 544, 546 can invert the high drive state to the low drive state and drive the low state onto the word line 506.

Figure 6:
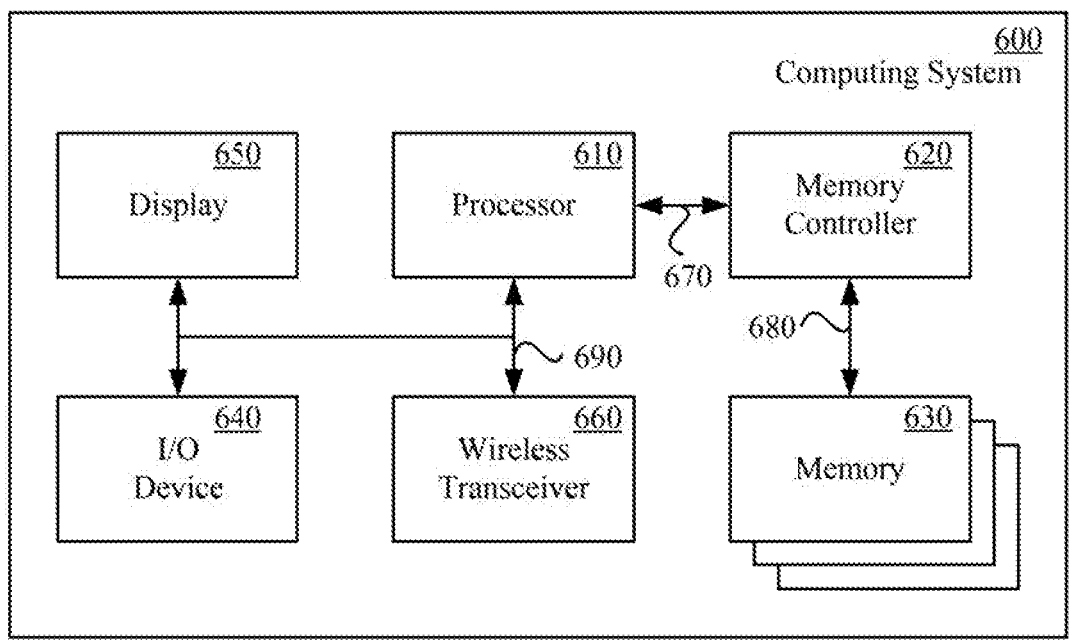
FIG. 6 shows a block diagram of a computing system including a memory device, in accordance with aspects of the present technology.

Referring now to FIG. 6, a block diagram of a computing system including a memory device, in accordance with aspects of the present technology, is shown. The computing system 600 can, for example, be a cellular telephone, smart phone, e-reader, tablet personal computer (PC), laptop PC, desktop PC, gaming console, workstation, server computer, or other similar computing device. The computing system 600 can include one or more processors 610, one or more memory controllers 620, one or more memory devices 630, and one or more input/output devices 640-660 communicatively coupled together by one or more buses 670-690. The one or more input/output devices 640 can include, for example, a display 650, a wireless transceiver 660 and the like. The computing system 600 can also include other sub-circuits that are not necessary for an understanding of the present technology and therefore are not discussed herein.

The one or more memory controllers 620 can be operable to control access to data stored in the one or more memory devices 630 for use by the one or more processors 610, one or more input/output devices 640 and/or other sub-systems of the computing system 600. The one or more memory controllers 620 can generate commands for reading and writing of data in the one or more memory devices 630 in response to memory requests received from the one or more processors 610, one or more input/output devices 640 and/or other sub-systems. One or more of the memory devices 630 can include the word line driver circuit as described herein with regard to FIGS. 2-4.

Figure 7:
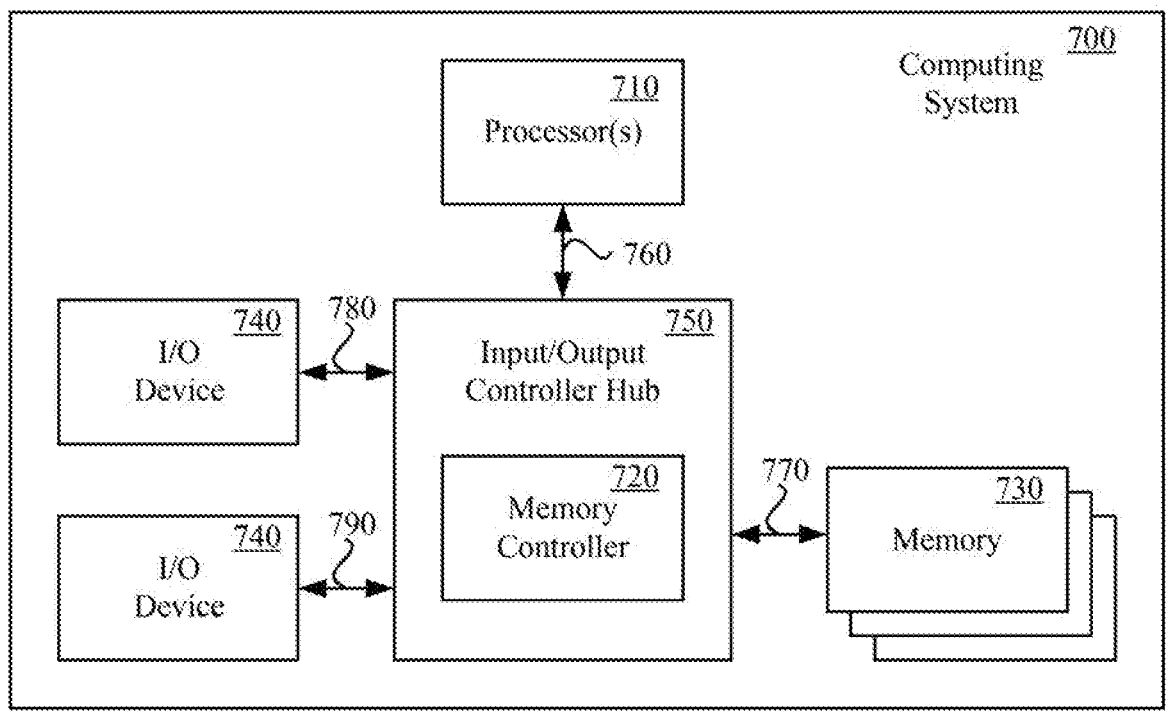
FIG. 7 shows a block diagram of a computing system including a memory device, in accordance with aspects of the present technology.

Referring now to FIG. 7, a block diagram of a computing system including a memory device, in accordance with aspects of the present technology, is shown. The computing system 700 can, for example, be a cellular telephone, smart phone, e-reader, table personal computer (PC), laptop PC, desktop PC, gaming console, workstation, server computer, or other similar computing device. The computing system 700 can include one or more processors 710, one or more memory controllers 720, one or more memory devices 730, and one or more input/output devices 740 that can be communicatively coupled together by one or more input/output controller hubs 750 through one or more buses 760-790. The computing system 700 can also include other sub-circuits that are not necessary for an understanding of the present technology and therefore are not discussed herein.

The one or more memory controllers 720 can be integral to one or more other sub-circuits such as the one or more input/output controller hubs 750 and/or memory devices 730, or can be implemented as a separate sub-circuit. The one or more memory controllers 720 can be operable to control access to data stored in the one or more memory devices 730 for use by the one or more processors 710, one or more input/output devices 740 and/or other sub-systems of the computing system 700. The one or more memory controllers 720 can generate commands for reading and writing of data in the one or more memory devices 730 in response to memory requests received from the one or more processors 710, one or more input/output devices 740 and/or other sub-systems. One or more of the memory devices 730 can include the word line driver circuit as described herein. with regard to FIGS. 2-4.

Figure 8:
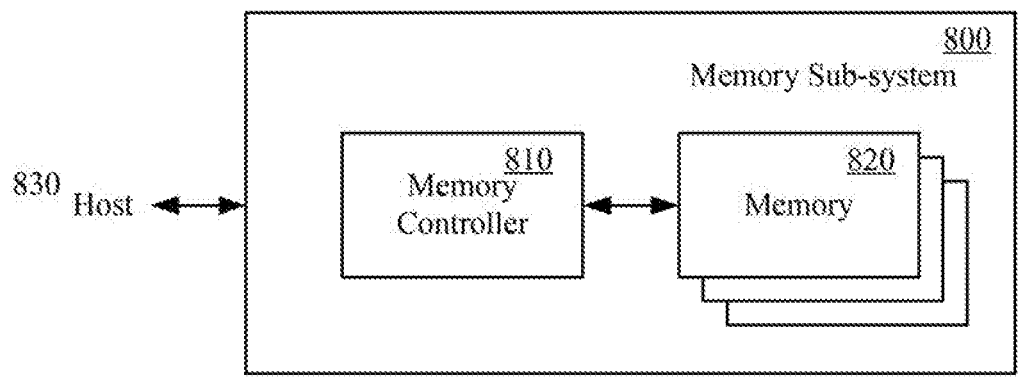
FIG. 8 shows a block diagram of a memory sub-system, in accordance with aspects of the present technology.

Referring now to FIG. 8, a block diagram of a memory sub-system, in accordance with aspects of the present technology, is shown. The memory sub-system 800 can include one or more memory controllers 810 and one or more memory devices 820. The memory sub-system 800 can be a memory expansion card, Solid State Drive (SSD), or the like that is configurable to be coupled to a host device 830 such as a cellular telephone, smart phone, e-reader, table personal computer (PC), laptop PC, desktop PC, gaming console, workstation, server computer, or other similar computing device. The memory sub-system 800 can be coupled to the host device 830 as in internal or external peripheral device.

The one or more memory controllers 810 can be operable to control access to data stored in the one or more memory devices 820 for use by the host device 830. The one or more memory controllers 810 can generate commands for reading and writing of data in the one or more memory devices 820 in response to memory requests received from the host device 830. One or more of the memory devices 820 can include the word line driver circuit as described herein with regard to FIGS. 2-4.

Figure 9:
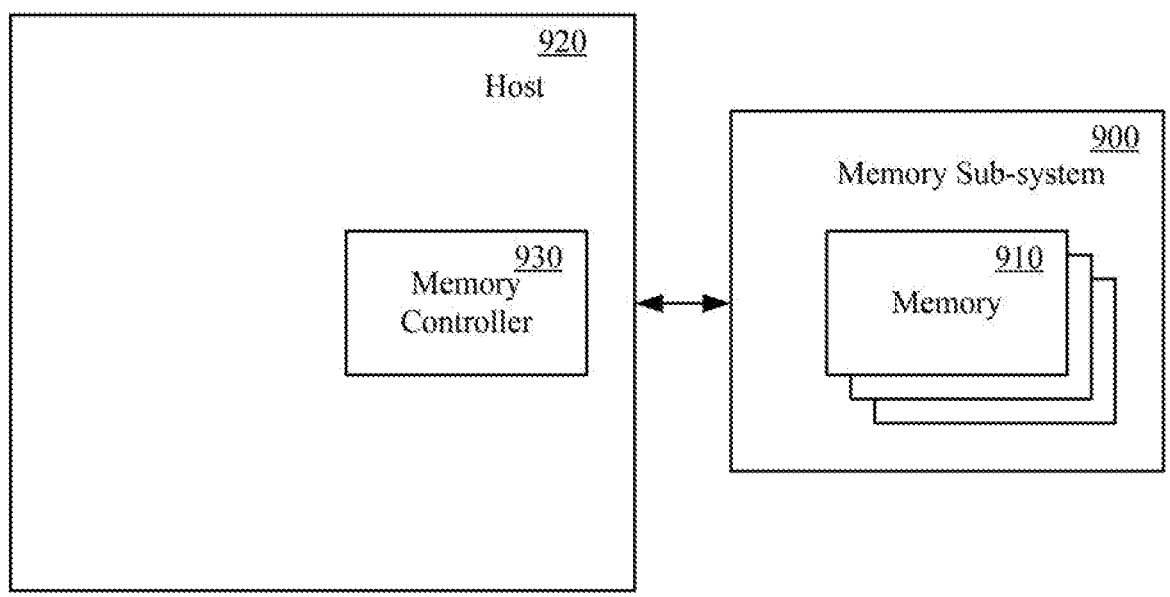
FIG. 9 shows a block diagram of a memory sub-system, in accordance with aspects of the present technology.

Referring now to FIG. 9, a block diagram of a memory sub-system, in accordance with aspects of the present technology, is shown. The memory sub-system 900 can include one or more memory devices 910. The memory sub-system 900 can be a memory expansion card, Solid State Drive (SSD), or the like that is configurable to be coupled to a host device 920 such as a cellular telephone, smart phone, e-reader, table personal computer (PC), laptop PC, desktop PC, gaming console, workstation, server computer, or other similar computing device. The host device 920 can include one or more memory controllers 930. The memory sub-system 900 can be coupled to the host device 920 as in internal or external peripheral device.

The one or more memory controllers 930 can be operable to control access to data stored in the one or more memory devices 910 for use by the host device 920. The one or more memory controllers 930 can generate commands for reading and writing of data in the one or more memory devices 910 in response to memory requests received from the host device 920. One or more of the memory devices can include the word line driver circuit 240 as described herein with regard to FIGS. 2-4.

The computing systems and memory sub-systems of FIG. 5-9 are illustrative of exemplary embodiments, and are not intended to limit aspects of the present technology. The word line driver circuit as described herein can be readily applied to any number of conventional memory devices, memory sub-systems, and/or computing systems, along with memory devices, memory sub-systems, and/or computing systems to be developed in the future.

The word line decoder and driver circuit in accordance with aspects of the present technology advantageously reduces delay in the word line driver circuit. In aspects, the address can be decoded and transfer to the master-slave level shifter latch as soon as the clock signal is received. The latching function is advantageously moved toward the end of the word line decoder and driver circuit. The delay of the word line decoder and driver circuit in accordance with aspects of the present technology can be the sum of the transmission gate delay and the propagation delay through the master-slave level shifter latch and word line driver (e.g., $T_B+T_u+T_{WdR}$), as compared to the sum of flip flop latch delay, the propagation delay through the address buffer, the propagation delay through the word line pro-decoder, the propagation delay through the word line decoder, and the propagation through the level shifter and word line driver (e.g., $Tc \rightarrow q+T_B+Twpd+Twd+Twdr$). Aspects of the present technology also advantageously eliminate the use of a clocked flip flop, which can reduce the area of the word line decoder and driver circuit in the Integrated Circuit (IC) chip of the device.

The foregoing descriptions of specific aspects of the present technology have been presented for purposes of illustration and description. They are not intended to be exhaustive or to limit the invention to the precise forms disclosed, and obviously many modifications and variations are possible in light of the above teaching. The aspects were chosen and described in order to best explain the principles of the present technology and its practical application, to thereby enable others skilled in the art to best utilize the present technology and various aspects with various modifications as are suited to the particular use contemplated. It is intended that the scope of the invention be defined by the claims appended hereto and their equivalents.

What is claimed is:

1. A memory device comprising:
   a plurality of word lines;
   a master-slave level shifter latch configured to receive a plurality of decoded address signals upon a first state of a clock signal, latch the received plurality of decoded address signals upon a second state of the clock signal and output a plurality of word line signals corresponding to the latched plurality of decoded address signals; and
   a word line driver configured to receive the plurality of word line signals and drive the plurality of word line signals on corresponding ones of the plurality of word lines.

2. The memory device of claim 1, wherein,
   the plurality of decoded address signals include a first state and a second state; and
   the plurality of word line signals include a third state and a fourth state, wherein a potential difference between the third state and the fourth state is greater than a potential difference between the first state and the second state.

3. The memory device of claim 1, wherein the master-slave level shifter latch comprises:
   a master latch including a first inverter cross-coupled to a second inverter configured to receive one of the plurality of decoded address signals upon the first state of the clock signal and latch the received one of the plurality of decoded address signals upon the second state of the clock signal; and
   a slave latch including a first level shifting inverter cross-coupled to a second level shifting inverter and configured to receive the latched one of the plurality of decoded address signals upon the second state of the clock signal, generate one of the plurality of word line signals corresponding to the latched one of the plurality of decoded address signals and latch the one of the plurality of word lines signals on a corresponding output upon the second state of the clock signal.

4. The memory device of claim 1, wherein the master slave level shifter latch comprises:
   a first transmission gate including a first terminal to receive a first one of the plurality of decoded address signals, a second terminal to receive the clock signal, a third terminal to receive an inverse of the clock signal, and configured to transfer a state of the first one of the plurality of decoded address signals received on the first terminal to a fourth terminal of the first transmission gate upon the first state of the clock signal;
   a first inverter including an input coupled to the fourth terminal of the first transmission gate;

a second inverter including an input coupled to an output of the first inverter;

a second transmission gate including a first terminal coupled to an output of the second inverter, a second terminal to receive the clock signal, a third terminal to receive the inverse of the clock signal, a fourth terminal coupled to the input of the first inverter, and configured to transfer a state of the output of the second inverter to the input of the first inverter upon the second state of the clock signal;

a third transmission gate including a first terminal coupled to the output of the first inverter, a second terminal to receive the clock signal, and configured to transfer a state of the output of the first inverter to an input of a third inverter upon the second state of the clock signal;

a fourth transmission gate including a first terminal coupled to the output of the third inverter, a second terminal to receive the clock signal, and configure to transfer a state of the output of the third inverter to the first terminal of the second transmission gate upon the second state of the clock signal;

the third inverter including an input coupled to the third terminal of the third transmission gate; and a fourth inverter including an input coupled to an output of the third inverter and an output coupled to the input of the third inverter, wherein the third and fourth inverters are configured to level shift the one of the plurality of word line signals and latch the level shifted one of the plurality of word line signals on a corresponding output upon the first state of the clock signal.

5. The memory device of claim 4, wherein:

the first transmission gate includes;

a first p-channel metal-oxide-semiconductor field effect transistor (MOSFET) including a drain terminal to receive the first one of the plurality of decoded address signals, a gate terminal to receive the first clock signal and a source terminal coupled the first terminal of the second transmission gate; and a first n-channel MOSFET including a source terminal to receive the first one of the plurality of decoded address signal, a gate terminal to receive the inverse of the first clock signal and a drain terminal coupled the first terminal of the second transmission gate; and the second transmission gate includes;

a second p-channel MOSFET including a drain terminal coupled to the fourth terminal of the first transmission gate, a gate terminal to receive the first clock signal and a source terminal coupled the input of the first inverter circuit; and a second n-channel MOSFET including a source terminal coupled to the fourth terminal of the first transmission gate, a gate terminal to receive the inverse of the clock signal first clock signal and a drain terminal coupled the input of the first inverter circuit.

6. The memory device of claim 1, further comprising:

an address buffer configured to receive and buffer a plurality of address signals;

a word line pre-decoder configured to receive the buffered plurality of address signals and output partially decoded address signals; and a word line decoder configured to receive the partially decoded address signal and output the plurality of decoded address signals.

7. The memory device of claim 1, further comprising:

an array of memory cells arranged in columns and rows, wherein sets of a first number of cells arranged along columns are coupled to corresponding ones of a plurality of bit lines and sets of a second number of cells arranged along rows are coupled to corresponding ones of the plurality of word lines.

8. The memory device of claim 7, wherein each memory cell includes a select gate and a Magnetic Tunnel Junction (MTJ) coupled in series between a corresponding one of the plurality of bit lines and a corresponding one of the plurality of source lines, and wherein a control terminal of the select gate is coupled to a corresponding one of the plurality of word lines.

9. The memory device of claim 7, wherein the army of memory cells comprise an array of Spin Torque Magnetoresistive memory cells.

10. A memory device comprising:

a first latch including a first inverter and a second inverter, wherein the first latch operates from a first supply potential;

a first transmission gate including a first control terminal to receive a clock signal, a second control terminal to receive an inverse of the clock signal, an input to receive a decoded address signal, and an output coupled to an input of the first inverter, wherein the first transmission gate is configured to transfer the received decoded address signal to the first latch during a first state of the clock signal;

a second transmission gate including a control terminal to receive the inverse of the clock signal, a second control terminal to receive the clock signal, an input coupled to an output of the second inverter, and an output coupled to the input of the first invert, wherein the second transmission gate is configured to cross couple the first and second inverter of the first latch during a second state of the clock signal; and a second latch including a third inverter cross coupled to a fourth inverter, wherein an output of the second latch is configured to output a level shifted word line signal corresponding to the received decoded address signal, and wherein the second latch operates from a second supply potential that is greater than the first supply potential;

a third transmission gate including a control terminal to receive the clock signal; and a fourth transmission gate including a control terminal to receive the clock signal, wherein the third and fourth transmission gates are configured to isolate the second latch from the first latch during the first state of the clock signal.

11. The memory device of claim 10, wherein:

the first transmission gate includes;

a first p-channel metal-oxide-semiconductor field effect transistor (MOSFET) including a drain terminal to receive the first one of the plurality of decoded address signals, a gate terminal to receive the first clock signal and a source terminal coupled the first terminal of the second transmission gate; and a first n-channel MOSFET including a source terminal to receive the first one of the plurality of decoded address signal, a gate terminal to receive the inverse of the first clock signal and a drain terminal coupled the first terminal of the second transmission gate; and the second transmission gate includes;

a second n-channel MOSFET including a drain terminal coupled to the fourth terminal of the first transmission gate, a gate terminal to receive the first clock signal and a source terminal coupled the output of the second inverter circuit; and a second p-channel MOSFET including a source terminal coupled to the fourth terminal of the first transmission gate, a gate terminal to receive the inverse of the clock signal first clock signal and a drain terminal coupled the output of the second inverter circuit.

12. The memory device of claim 10, wherein:
the third transmission gate includes an n-channel Metal Oxide Semiconductor Field Effect Transistor (MOSFET) including a gate configured to receive the clock signal, a source coupled to the output of the first inverter and the input of the second inverter, and a drain coupled to the input of the third inverter and the output of the fourth inverter; and
the fourth transmission gate includes an n-channel MOSFET including a gate configured to receive the clock signal, a source coupled to the output of the second inverter and the input of the second transmission gate, and a drain coupled to an output of the third inverter and the input of the fourth inverter.

13. The memory device of claim 10, wherein:
the third inverter includes a first p-MOSFET and a first n-MOSFET, wherein a gate of the first p-MOSFET and a gate of the first n-MOSFET are coupled together as the input of the third inverter, a drain of the first p-MOSFET and a drain of the first n-MOSFET are coupled together as the output of the third inverter, a source of the first p-MOSFET is coupled to the second supply potential and a source of the first n-MOSFET coupled to a ground potential; and
the fourth inverter includes a second p-MOSFET and a second n-MOSFET, wherein a gate of the second p-MOSFET and a gate of the second n-MOSFET are coupled together as the input of the fourth inverter, a drain of the second p-MOSFET and a drain of the second n-MOSFET are coupled together as the output of the fourth inverter, and a source of the second p-MOSFET is coupled to the second supply potential and a source of the second n-MOSFET is coupled to the ground potential.

14. The memory device of claim 10, further comprising inverting driver including a p-MOSFET and a n-MOSFET, wherein a gate of the p-MOSFET and a gate of the n-MOSFET are coupled together as the input of the inverting driver, a drain of the p-MOSFET and a drain of the n-MOSFET are coupled together as the output of the inverting driver, and a source of the p-MOSFET is coupled to the second supply potential and a source of the n-MOSFET coupled to a ground potential.

15. The memory device of claim 10, further comprising:
an address buffer configured to receive and buffer a plurality of address signals;
a word line pre-decoder configured to receive the buffered plurality of address signals and output partially decoded address signals; and
a word line decoder configured to receive the partially decoded address signal and output a plurality of decoded address signals, wherein the input of the first transmission gate is configured to receive one of the plurality of decoded address signals.

16. The memory device of claim 10, further comprising:
an array of memory cells arranged in columns and rows, wherein sets of a first number of cells arranged along columns are coupled to corresponding ones of a plurality of bit lines and sets of a second number of cells arranged along rows are coupled to corresponding ones of the plurality of word lines.

17. The device of claim 16, wherein each memory cell includes a select gate and a Magnetic Tunnel Junction (MTJ) coupled in series between a corresponding one of the plurality of bit lines and a corresponding one of the plurality of source lines, and wherein a control terminal of the select gate is coupled to a corresponding one of the plurality of word lines.

18. The memory device of claim 16, wherein the array of memory cells comprise an array of Spin Torque Magnetoresistive memory cells.

19. A memory device comprising:
a memory cell array including a plurality of word lines;
an address buffer configured to buffer a plurality of address signals, wherein the address buffer operates from a first supply potential:
an address decoder circuit configured to receive the buffered plurality of address signals and output a plurality of decoded address signals, wherein the address decoder operates from the first supply potential;
a master-slave level shifter latch configured to receive the plurality of decoded address signals upon a first state of a clock signal, to latch and level shift the decoded address signals upon a second state of a clock signal to generate a corresponding plurality of word line signals, and to output the plurality of word line signals, wherein the master-slave level shifter latch operates from a second supply potential that is greater than the first supply potential; and
a word line driver configured to receive the plurality of word line signals and drive the plurality of word line signals on corresponding ones of the plurality of word lines, wherein the word line driver operates form the second supply potential.

20. The memory device of claim 19, wherein the memory cell array comprises a Magnetoresistive memory cell array.

21. The memory device of claim 19, wherein the master-slave level shifter latch comprises:
a first transmission gate including a first terminal to receive a first one of the plurality of decoded address signals, a second terminal to receive the clock signal, a third terminal to receive an inverse of the clock signal, and configured to transfer a state of the first one of the plurality of decoded address signals received on the first terminal to a fourth terminal of the first transmission gate upon the first state of the clock signal;
a first inverter including an input coupled to the fourth terminal of the first transmission gate;
a second inverter including an input coupled to an output of the first inverter;
a second transmission gate including a first terminal coupled to an output of the second inverter, a second terminal to receive the clock signal, a third terminal to receive the inverse of the clock signal, a fourth terminal coupled to the input of the first inverter, and configured to transfer a state of the output of the second inverter to the input of the first inverter upon the second state of the clock signal;
a third transmission gate including a first terminal coupled to the output of the first inverter, a second terminal to receive the clock signal, and configured to transfer a state of the output of the first inverter to an input of a third inverter upon the second state of the clock signal;
a fourth transmission gate including a first terminal coupled to the output of the third inverter, a second terminal to receive the clock signal, and configure to transfer a state of the output of the third inverter to the output of the second inverter upon the second state of the clock signal;

the third inverter including an input coupled to the third terminal of the third transmission gate; and a fourth inverter including an input coupled to an output of the third inverter and an output coupled to the input of the third inverter, wherein the third and fourth inverters are configured to level shift the one of the plurality of word line signals and latch the level shifted one of the plurality of word line signals on a corresponding output upon the second state of the clock signal.

22. The memory device of claim 19, wherein the word line driver comprises:

an inverting driver including an input coupled to an output of the third inverter and an output coupled to a corresponding one of the plurality of word lines, wherein the inverting driver operates from the second supply potential.

* * * * *